(12) United States Patent
Nagai et al.

(10) Patent No.: US 8,455,070 B2
(45) Date of Patent: Jun. 4, 2013

(54) HINGED CARRIAGE CASE FOR ELECTRONICAL PARTS HAVING ANTISTATIC PROPERTIES

(75) Inventors: Ken Nagai, Fukui (JP); Takashi Shimada, Minamisaitama-gun (JP); Yoshiyuki Nakajima, Sagamihara (JP)

(73) Assignee: Sakase Chemical Co., Ltd., Fukui (JP)

( * ) Notice: Subject to any disclaimer, the term of this patent is extended or adjusted under 35 U.S.C. 154(b) by 492 days.

(21) Appl. No.: 12/451,787
(22) PCT Filed: May 30, 2008
(86) PCT No.: PCT/JP2008/001362
§ 371 (c)(1),
(2), (4) Date: Dec. 1, 2009
(87) PCT Pub. No.: WO2008/149528
PCT Pub. Date: Dec. 11, 2008

(65) Prior Publication Data
US 2010/0176013 A1   Jul. 15, 2010

(30) Foreign Application Priority Data
Jun. 5, 2007   (JP) .................. 2007-149098

(51) Int. Cl.
*B65D 85/30*   (2006.01)
*B65D 85/86*   (2006.01)
(52) U.S. Cl.
USPC ....... 428/35.7; 428/34.1; 220/4.01; 220/4.27; 220/4.22; 206/449; 206/503; 206/706; 206/723; 206/719; 206/308.1; 206/308.3
(58) Field of Classification Search
USPC .............. 206/449, 503, 706, 723, 716, 719, 206/308.1, 308.3; 220/4.01, 4.27, 4.22; 428/34.1, 35.7
See application file for complete search history.

(56) References Cited

U.S. PATENT DOCUMENTS 1,247,848 A  *  11/1917  List .................... 206/45.23
1,378,363 A  *   5/1921  List .................... 206/45.23
(Continued)

FOREIGN PATENT DOCUMENTS

JP    A-61-190471    8/1986
JP    U-61-141238    9/1986
(Continued)

OTHER PUBLICATIONS

International Search Report issued in International Application No. PCT/JP2008/001362; Mailed on Aug. 19, 2008.

*Primary Examiner* — Michele L Jacobson
(74) *Attorney, Agent, or Firm* — Oliff & Berridge, PLC (57) ABSTRACT

A carriage case, in which electronical parts are received for transportation, is provided as being capable of securely holding such parts therein and preventing them from being damaged and hampering dust from attaching on them with the removal of electrostatic charge and reducing gas detrimental to such parts to the minimum. The carriage case comprises: a case body having a base member and a cover member; and a sheet member that is made from an adhesive material of curable composition essentially consisting of component (A): a polyoxyalkylene based polymer having more than one alkenyl groups in one molecule, component (B): a compound having at least two hydrosilyl groups in one molecule and component (C): a hydrosilylation catalyst. The sheet member is applied on an inner bottom side surface of the base member and on the sheet member. The parts are attached so as to be securely positioned in the case.

15 Claims, 3 Drawing Sheets

U.S. PATENT DOCUMENTS

| | | | | |
|---|---|---|---|---|
| 3,273,779 | A | * | 9/1966 | Mykleby .................. 206/523 |
| 3,333,726 | A | * | 8/1967 | Belanger .................. 220/836 |
| 3,511,990 | A | * | 5/1970 | Hauss ..................... 378/187 |
| 3,783,999 | A | * | 1/1974 | Smith ..................... 206/45.23 |
| 4,211,324 | A | * | 7/1980 | Ohlbach ................... 206/709 |
| 4,241,829 | A | * | 12/1980 | Hardy ..................... 206/709 |
| 4,585,121 | A | * | 4/1986 | Capelle, Jr. ............... 206/719 |
| 4,643,308 | A | * | 2/1987 | Michel .................... 206/308.3 |
| 4,706,161 | A | * | 11/1987 | Buckingham .............. 361/220 |
| 4,706,438 | A | * | 11/1987 | Ohlbach ................... 53/411 |
| 4,767,003 | A | * | 8/1988 | Rice et al. ................ 206/719 |
| 4,773,534 | A | * | 9/1988 | DeHeras et al. ............ 206/709 |
| 4,809,908 | A | * | 3/1989 | Keefe et al. ............... 229/150 |
| 4,906,494 | A | * | 3/1990 | Babinec et al. ............. 428/35.2 |
| 5,012,924 | A | * | 5/1991 | Murphy ................... 206/719 |
| 5,107,989 | A | * | 4/1992 | Becker .................... 206/720 |
| 5,109,980 | A | * | 5/1992 | Matsuoka et al. ........... 206/724 |
| 5,167,326 | A | * | 12/1992 | Murphy ................... 206/719 |
| 5,223,121 | A | * | 6/1993 | Dickie et al. ............... 206/591 |
| 5,259,498 | A | * | 11/1993 | Weisburn et al. ........... 206/756 |
| 5,270,901 | A | * | 12/1993 | Nowak et al. .............. 361/212 |
| 5,303,820 | A | * | 4/1994 | Comtois ................... 206/706 |
| 5,388,713 | A | * | 2/1995 | Taniyama .................. 220/4.22 |
| 5,392,906 | A | * | 2/1995 | Taniyama .................. 206/311 |
| 5,411,134 | A | * | 5/1995 | Temple et al. .............. 206/753 |
| 5,452,183 | A | * | 9/1995 | Renn et al. ................ 361/789 |
| 5,484,063 | A | * | 1/1996 | Cuccio et al. .............. 206/722 |
| 5,531,328 | A | * | 7/1996 | Rochelo et al. ............. 206/706 |
| 5,673,795 | A | * | 10/1997 | Clatanoff et al. ............ 206/719 |
| 5,738,219 | A | * | 4/1998 | Arsena et al. .............. 206/706 |
| 5,762,224 | A | * | 6/1998 | Benn et al. ................ 220/4.02 |
| 5,811,184 | A | * | 9/1998 | Anderson et al. ........... 428/343 |
| 5,823,352 | A | * | 10/1998 | Mena et al. ............... 206/721 |
| 5,954,203 | A | * | 9/1999 | Marconi ................... 206/464 |
| 6,019,238 | A | * | 2/2000 | Kindig et al. .............. 220/4.22 |
| D436,314 | S | * | 1/2001 | Hansen .................... D9/422 |
| 6,193,069 | B1 | * | 2/2001 | Guenther et al. ........... 206/723 |
| 6,196,405 | B1 | * | 3/2001 | Kambouris ................ 220/4.22 |
| 6,367,642 | B2 | * | 4/2002 | Kambouris et al. ......... 220/4.22 |
| 6,401,930 | B1 | * | 6/2002 | Boyer et al. ............... 206/721 |
| 6,772,905 | B2 | * | 8/2004 | Cheng ..................... 220/840 |
| 6,826,828 | B1 | * | 12/2004 | Shen ...................... 29/832 |
| 7,329,443 | B2 | * | 2/2008 | Masuki et al. ............. 428/35.7 |
| 7,775,358 | B1 | * | 8/2010 | Huang ..................... 206/379 |
| 2005/0112331 | A1 | * | 5/2005 | Donea et al. .............. 428/166 |
| 2007/0049707 | A1 | | 3/2007 | Ueda et al. |

FOREIGN PATENT DOCUMENTS

| | | |
|---|---|---|
| JP | A-2001-171782 | 6/2001 |
| JP | A-2006-325633 | 12/2006 |
| WO | WO 2005/033239 A1 | 4/2005 |

* cited by examiner

HINGED CARRIAGE CASE FOR ELECTRONICAL PARTS HAVING ANTISTATIC PROPERTIES

TECHNICAL FIELD

The present invention relates to an improvement on a carriage case for electronical parts, in more details, pertaining to such carriage case as being capable of securely holding such parts therein and preventing them from being damaged as well as hampering dust from attaching on them with the removal of electrostatic charge and capable of reducing gas (or outgas) detrimental to such parts as received therein to the minimum.

PRIOR ARTS

Conventionally, for the carriage of such parts, it often happens that they are transported in an exclusive carriage case due to the fact that they are minute in size and delicate in nature, inside of which case an adhesive sheet member is provided to make them attached thereon for securely holding them therein, as referred to in the Patent Document 1 as commented below.

However, with such conventional carriage case as mentioned above, such problem has happened as gas (a so-called 'outgas') such as a siloxane gas (having a siloxane bonding: —Si—O—Si—O—) detrimental to the electronical parts being generated because silicone is adopted for the material of the adhesive sheet member provided therein.

Further, the carriage case in which such parts are contained is made from plastics, so that electrostatic charge unavoidably occurs on the surface, which charge is likely to do damage on such parts and to absorb dust resulting in being attached on them.

(Patent Document 1) Japanese Patent Application Laid-open No. 2006-325633 (see Pages 4 through 5 and FIG. 1).

DISCLOSURE OF THE INVENTION

Issues to be Solved

In view of the above inconveniences encountered with the prior carriage case for electronical parts, the present invention is to provide such carriage case as being capable of securely holding such parts therein and preventing them from being damaged and hampering dust from being attached on them with the removal of electrostatic charge as well as of reducing gas (outgas) detrimental to such parts to the minimum.

Means to Solve the Issues

The means adopted for solving the above prior issues by the inventors are described as follows with reference to the accompanying drawings.

Namely, a carriage case according to the invention in which electronical parts P are received for transportation comprises: a case body 1 having a base member 11 and a cover member 12; and a sheet member 2 that is made from an adhesive material of curable composition essentially consisting of component (A): a polyoxyalkylene based polymer having more than one alkenyl groups in one molecule, component (B): a compound having at least two hydrosilyl groups in one molecule and component (C): a hydrosilylation catalyst, the sheet member 2 being applied on an inner bottom side surface of the base member 11 and on the sheet member 2 the parts P being attached so as to be securely positioned in the case.

Further, in addition to the above means and where appropriate, the invention is characterized in that the above component (A) of curable composition for the sheet member 2 comprises a polyoxyalkylene based polymer having alkenyl groups, the number-average molecular weight of which polymer ranges from 3,000 to 50,000.

Furthermore, in addition to the above means and where appropriate, the invention is characterized in that the above component (B) of curable composition for the sheet member 2 comprises a compound having hydrosilyl groups as represented with the structural formula 1 below, in which formula the relation between 'm' and 'n' is expressed with $1<m+n\leq40$, $1<m\leq20$, $0<n\leq38$ and the 'R' stands for a hydrocarbon group having a main chain having 2 to 20 carbon atoms and may contain one or more phenyl groups.

(Structural formula 1)

Moreover, in addition to the above means and where appropriate, the invention is characterized in that the base member 11 of the case body 1 is made from a resinous material having electrical conductivity and formed into a bottomed box shape.

Further, in addition to the above means and where appropriate, the invention is characterized in that the fringe portions of the base member 11 and the cover member 12 of the case body 1 are hinged together.

Moreover, in addition to the above means and where appropriate, the invention is characterized in that ribs 12a are provided on the side surfaces of the cover member 12 opposite to the base member 11 so as to make into contact with at least a portion of the inner bottom side surface of the base member 11, with the result that electrostatic charge carried on the cover member 12 can be removed.

Furthermore in addition to the above means and where appropriate, the invention is characterized in that a hinge protrusion 12b is formed contiguously to the opposite corners respectively at the fringe sides of the cover member 12 whereas hinge receptacles 11a are correspondingly formed on the base member 11, whereby the one hinge protrusion 12b is inserted into the corresponding hinge receptacle 11a and the other hinge protrusion 12b in a substantially semi-circular section is slid through an opening 11b into the corresponding hinge receptacle 11a, thereby, the cover member 12 being pivoted on the base member 11 such that the former is detachable from the latter upon the former being opened flat.

Also, in addition to the above means and where appropriate, the invention is characterized in that a side wall 11c is formed on the respective opposite fringe portions of the base member 11, along which walls the ribs 12a of the cover member 12 contact the inner bottom surface of the base member 11 so as to shut up the side surfaces of the base member 11.

Furthermore, in addition to the above means and where appropriate, the invention is characterized in that segments 21 are provided in the sheet member 2, in which segments respectively the electronical parts P respectively are disposed.

Moreover, in addition to the above means and where appropriate, the invention is characterized in that the base member 11 of the case body 1 is made from a resin whose outgas emission amounts to 0.8 ppm or below according to GC/MS method under the condition that the resin is heated for three hours under the temperature of 85 degrees Centigrade.

Also, in addition to the above means and where appropriate, the invention is characterized in that the convex portions 11d are provided on an upper surface of the base member 11 while concave portions 11e are provided on a lower surface thereof, into which concave portions the convex portions 11d of another case body 1 are inserted so as to make a plurality of the case bodies 1 stacked one over another.

Effect

A carriage case according to the invention in which electronical parts are received for transportation comprises: a case body having a base member and a cover member; and a sheet member that is made from an adhesive material of curable composition essentially consisting of component (A): a polyoxyalkylene based polymer having more than one alkenyl groups in one molecule, component (B): a compound having at least two hydrosilyl groups in one molecule and component (C): a hydrosilylation catalyst, the sheet member being applied on an inner bottom side surface of the base member and on the sheet member the parts being attached so as to be securely positioned in the case.

Thus, the use of the carriage case according to the invention allows the electronical parts to be securely held therein and to reduce the emission of such gas as siloxane gas (outgas) detrimental to such parts to the minimum.

According to the invention, where appropriate, the base member 11 of the case body 1 is made from a resinous material having electrical conductivity and formed into a bottomed box shape, thereby, electrostatic charge carried on the cover member 12 being readily earthed to escape.

Also, according to the invention, where appropriate, the fringe portions of the base and cover members are hinged together so as to facilitate the opening and closing of the case body.

Further, where appropriate, ribs are provided on the side surfaces of the cover member opposite to the base member so as to make into contact with at least a portion of the inner bottom side surface of the base member, with the result that electrostatic charge carried on the cover member can escape so as to prevent the electronical parts from being damaged and dust from being attached on them.

Furthermore, where appropriate, a hinge protrusion is formed in the vicinity of the opposite corners respectively at the fringe sides of the cover member whereas the corresponding hinge receptacles are formed on the base member, whereby the one hinge protrusion is inserted into the corresponding hinge receptacle and the other hinge protrusion in a substantially semi-circular section is slid through an opening into the corresponding hinge receptacle, thereby, the cover member being pivoted on the base member such that the former is detachable from the latter upon the former being opened flat, thus, the cover member being left detached from the base member upon the electronical parts being disposed on the sheet member so that the cover member does not bother an operator from disposing such parts thereon.

Moreover, where appropriate, a side wall is formed on the respective opposite fringe portions of the base member, along which walls ribs of the cover member contact the inner bottom surface of the base member so as to shut up the side surfaces of the base member, which physically minimizes the invasion of dust into the case so that the industrial applicability of the carriage case according to the invention is very high.

BEST MODE FOR CARRYING OUT THE INVENTION

The preferred embodiment of the invention is described below with reference to the accompanying drawings.

The present embodiment is explained with reference to FIGS. 1 through 6. In the drawings, numeral reference 1 indicates a case body, which case body comprises a base member 11 and a cover member 12. The base member 11 is made from a resinous material having electrical conductivity (stat-kon polycarbonate being exemplified herein) and formed into a bottomed box shape. Ribs 12a are provided on the side surfaces of the cover member 12 opposite to the base member 11.

Numeral reference 2 indicates a sheet member, which member is made from an adhesive material of curable composition and explained in details as follows.
(Explanation on the Sheet Member 2)

The sheet member 2 according to the present embodiment is, as described above, made from a curable composition (polyether rubber based material being exemplified herein) essentially consisting of component (A): a polyoxyalkylene based polymer having more than one alkenyl groups in one molecule, component (B): a compound having at least two hydrosilyl groups in one molecule and component (C): a hydrosilylation catalyst.

The component (A) of the sheet member 2 or a polyoxyalkylene based polymer having more than one alkenyl groups in one molecule according to the embodiment is not limited to one particular type among those known to the persons in the art, but may be exemplified with such polymer as its main chain skeleton having a repeating unit represented with the following general formula (1).

, General Formula (1):

wherein the 'R$^1$' indicates a bivalent alkylene group.

The 'R$^1$' thereof is not limited to one particular type of such bivalent alkylene group provided that it belongs to such group, but may preferably comprise an alkylene group having 1 to 14 carbon atoms and more preferably comprise an alkylene group of linear or branched type having 2 to 4 carbon atoms.

The repeating unit of the above-mentioned general formula (1) is not limited to one particular type, but may include —CH$_2$O—, —CH$_2$CH$_2$O—, —CH$_2$CH(CH$_3$)O—, —CH$_2$CH(C$_2$H$_5$)O—, —CH$_2$C(CH$_3$)$_2$O—, —CH$_2$CH$_2$CH$_2$CH$_2$O—, for examples.

The main chain skeleton of the polyoxyalkylene based polymer may comprise either only one kind of the repeating unit or plural kinds of repeating units in combination. Among those repeating units as mentioned above, it is preferred that the polymer should have the principal repeating unit comprising —CH$_2$CH(CH$_3$)O— in its main chain skeleton due to readily availability and excellent workability.

Further, other repeating units than the oxyalkylene units may be included in the main chain skeleton of the polymer, in which case the total weight percent of the oxyalkylene units to the polymer preferably amounts to 80 wt % or more, more preferably, amounting to 90 wt % or more.

The main chain skeleton of the polymer comprising the component (A) may be of either linear or branched type, or may be of blended type between them. To achieve fine elasticity, it is preferable that 50 wt % or more of the main chain skeleton of the polymer be of linear type.

The number-average molecular weight of the polymer comprising the component (A) preferably ranges from 1,000 to 70,000, more preferably ranging from 3,000 to 50,000, most preferably ranging from 5,000 to 30,000. The polymer whose number-average molecular weight is less than 1,000 makes a cured product fragile so as to weaken rubber elasticity whereas that whose number-average molecular weight goes beyond 50,000 makes a cured product highly viscous so as to make it hard to handle. The number-average molecular weight of the polyoxyalkylene based polymer is measurable in various ways, but normally measured by conversion resulting from the terminal groups analysis thereof or by means of Gel Penetration Chromatography (GPC).

The alkenyl group contained in the component (A) is not limited to one particular type, but may be selected from those groups as publicly known to the persons in the art. Among them, the alkenyl group represented with the following general formula (2) is preferred.

$$H_2C=C(R^2)-,\qquad \text{General Formula (2):}$$

wherein the '$R^2$' indicates hydrogen or methyl group.

The bonding of the alkenyl group to the polyoxyalkylene based polymer is not limited to one particular type, but may include direct bond, ether bond, ester bond, carbonate bond, urethane bond, urea bond, by way of examples.

The polymer comprising the component (A) is exemplified herein with the representation of the following general formula (3).

$$\{H_2C=C(R^3)-R^4-O\}_a-R^5,\qquad \text{General Formula (3):}$$

wherein the '$R^3$', '$R^4$', '$R^5$' and 'a' indicate hydrogen or methyl group, a bivalent hydrocarbon group having 1 to 20 carbon atoms in which one or more ether groups may be contained, residue of the polyoxyalkylene based polymer and a positive integer, respectively.

The '$R^4$' thereof is not limited to one specific type, but may include —$CH_2$—, —$CH_2CH_2$—, —$CH_2CH_2CH_2$—, —$CH_2CH(CH_3)CH_2$—, —$CH_2CH_2CH_2CH_2$—, —$CH_2CH_2OCH_2CH_2$—, —$CH_2CH_2OCH_2CH_2CH_2$—, for examples. Among them, —$CH_2$— is preferred because it is easily synthesized.

Besides, the polymer comprising the component (A) may be exemplified with the representation of the following general formula (4) showing an ester bond.

$$\{H_2C=C(R^3)-R^4-OC(=O)\}_a-R^5,\qquad \text{General Formula (4):}$$

wherein the '$R^3$', '$R^4$', '$R^5$' and 'a' are the same as those of the formula (3).

Also, the polymer may be exemplified with the representation of the following general formula (5).

$$\{H_2C=C(R^3)\}_a-R^5,\qquad \text{General Formula (5):}$$

wherein the '$R^3$', '$R^5$' and 'a' are the same as those of the general formulae (3) and (4).

Further, the polymer may be exemplified with the representation of the following general formula (6) showing a carbonate bond.

$$\{H_2C=C(R^3)-R^4-OC(=O)O\}_a-R^5,\qquad \text{General Formula (6):}$$

wherein the '$R^3$', '$R^4$', '$R^5$' and 'a' are the same as those of the above general formulae (3), (4) and (5) respectively.

The polymerization method for the polyoxyalkylene based polymer (A) is not limited to one specific type, but may include that of oxyalkylene (or anionic polymerization using caustic alkali) as disclosed in Japanese Patent Application Laid-open No. 50-13496 and so forth, that by chain extension reaction method using the polymer obtained by the above anionic polymerization as a starting material as disclosed in Japanese Patent Application Laid-open No. 50-149797 and so forth, that using cesium metal catalyst as disclosed in Japanese Patent Application Laid-open No. 7-179597 and so forth, that using porphyrin/aluminium complex catalyst as disclosed in Japanese Patent Application Laid-open Nos. 61-197631, 61-215622, 61-215623 and 61-218632, that using a double-metal cyanide complex catalyst as disclosed in Japanese Patent Laid-open Nos. 46-27250, 59-15336 and so forth and that using polyphosphazene salt catalyst as disclosed in Japanese Patent Application Laid-open No. 10-273512 and so forth.

Among them, in practice, the polymerization method using the double-metal cyanide complex catalyst is preferred because of easy availability and stability of polymerization. The production method of the double-metal cyanide complex catalyst is not limited to one specific type, but may preferably include such prior methods as disclosed in U.S. Pat. Nos. 3,278,457, 3,278,459, 5,891,818, 5,767,323, 5,536,883, 5,482,908, 5,158,922, 4,472,560, 6,063,897, 5,891,818, 5,627,122, 5,482,908, 5,470,813, 5,158,922 and so forth.

The synthesis of the polyoxyalkylene based polymer (Component (A)) having more than one alkenyl groups in one molecule is not limited to one particular type, but may include, besides the conventional polymerization methods (an anionic polymerization using caustic alkali) to produce the polyoxyalkylene based polymer and the chain extension reaction method using this polymer as a starting material, those as disclosed in Japanese Patent Application Laid-open Nos. 61-197631, 61-215622, 61-215623, 61-218632, 46-27250 and 59-15336, for examples.

The introduction of an alkenyl group into the polyoxyalkylene based polymer is not limited to one specific method, but may be selected from those as disclosed in the prior arts, copolymerization of a monomer having an alkenyl group such as an allylglycidyl ether and an oxyalkylene monomer being exemplified herein.

The introduction of an alkenyl group into the main or side chain of the polymer is not limited to one specific method, but may be effected by reacting an oxyalkylene polymer having a functional group such as a hydroxyl group, an alkoxide group and the like in the main chain or a side chain with an organic compound having a functional group and an alkenyl group, which shows reactivity with the former functional groups. To note, a curable composition containing the polymer, in the main chain terminal of which polymer the alkenyl group is present, is preferred as it results in a cured product having a greater length of an effective network chain so as to excel in mechanical properties.

The organic compound having a functional group and an alkenyl group, which shows reactivity with the former functional groups as mentioned above, is not limited to one specific compound, but may include acrylic acid, methacrylic acid, vinyl acetate, an acid halide of unsaturated fatty acid having 3 to 20 carbon atoms such as acrylic chloride, acrylic bromide and the like, acid anhydride, allyl chloroformate, allylchloride, allylbromide, vinyl(chloromethyl)benzene, allyl(chloromethyl)benzene, allyl(bromomethyl)benzene, allyl(chloromethyl)ether, allyl(chloromethoxy)benzene, 1-butenyl(chloromethyl)ether, 1-hexenyl(chloromethoxy)benzene, allyloxy(chloromethyl)benzene, by way of examples.

The number of alkenyl groups in one molecule of the polymer or component (A) preferably amounts to more than one, but five or less. The number of the alkenyl groups in one molecule thereof being one or nothing, the curability of the composition tends to be insufficient, which makes the network structure of the cured product incomplete, so that it results in being of poor quality. On the other hand, the larger the number of alkenyl groups therein becomes, the denser the network structure of the cured product becomes so that it tends to be brittle. Such tendency becomes conspicuous when such number goes beyond 5.

The component (B) of the sheet member 2 according to the embodiment or a compound having at least two hydrosilyl groups in one molecule is not limited to one particular compound, but any compounds having hydrosilyl groups therein will do. Among them, organohydrogenpolysiloxane modified with an organic group is preferred because of readily availability, better compatibility with the component (A) and as such.

The number-average molecular weight of the compound or component (B) having such hydrosilyl groups therein preferably ranges from 400 to 3,000, more preferably, ranging from 500 to 1,000. The curable composition using the compound or component (B) whose number-average molecular weight is less than 400 has such tendency that the component (B) volatilizes during thermal curing resulting in the cured product being of poor quality. On the other hand, that using the compound or component (B) whose number-average molecular weight goes beyond 3,000 is subject to insufficient curing speed.

The compound or component (B) is preferred to be good at compatibility with the polymer or component (A). Especially, the use of the component (B) with poor compatibility with the component (A), when the viscosity of the curable composition is low, tends to cause curing failure along with phase separation during storage and the like.

The organohydrogenpolysiloxan is not limited to one particular compound, but may include compounds having chain or cyclic structures as represented with the following structural formulae.

(Structural Formula 2)

wherein the relation between 'b' and 'c' is expressed with $1<b+c\leq40$, $1<b\leq20$, $0<c\leq38$. 'R' is a hydrocarbon group having a main chain having 2 to 20 carbon atoms and may contain one or more phenyl groups.

(Structural Formula 3)

wherein the relation between 'd' and 'e' is expressed with $0\leq d+e\leq40$, $0\leq d\leq20$, $0<e\leq38$. 'R' is a hydrocarbon group having a main chain having 2 to 20 carbon atoms and may well contain one or more phenyl groups.

(Structural Formula 4)

wherein the relation between 'f' and 'g' is expressed with $3\leq f+g\leq20$, $1<f\leq20$, $0<g\leq18$. 'R' is a hydrocarbon group having a main chain having 2 to 20 carbon atoms and may well contain one or more phenyl groups.

The component (B) that is good at compatibility with the components (A) and (C) or comparatively good at dispersion stability and curing speed is not limited to one particular compound, but may include compounds having such structure as represented with the following structural formula, for example.

(Structural Formula 5)

wherein the relation between 'k' and 'l' is expressed with $1<k+l\leq20$, $1<k\leq19$, $0<l\leq18$. 'R' is a hydrocarbon group whose carbon atoms amounts to 8 or more.

The preferred component (B), in order to secure compatibility with the component (A) and to control SiH amount, may include such compounds as methylhydrogenpolysiloxane being modified with α-olefin, styrene, α-methylstyrene, allyl alkyl ether, allyl alkyl ester, allyl phenyl ether, allyl phenyl ester, one of which compounds is represented with the following structural formula.

(Structural Formula 6)

wherein the relation between 'p' and 'q' is expressed with $1<p\leq20$, $1<p\leq19$, $0<q\leq18$.

The amount by which the component (B) according to the embodiment or compound having hydrosilyl groups therein is used depends on the correlation between the amount of the alkenyl groups existing in the polymer or the component (A) and that of the hydrosilyl groups existing in the compound or the component (B), in which [amount of the hydrosilyl groups contained in the component (B)]/[amount of the alkenyl groups contained in the component (A)] is preferably 0.5 or more, more preferably 0.7 or more.

A curable composition whose correlation as mentioned above is less than 0.5 causes a cured product to have a soft rubber portion therein whose crosslinking density is low so as to result in being highly viscous and complicating making a complex moulded product.

On the other hand, such curable composition as the amount of the hydrosilyl groups contained in the component (B) being far greater than that of the alkenyl groups contained in the component (A) interrupts a cured product from forming a tri-dimensional network skeleton therein so as to complicate making a complex moulded product. Thus, due attention shall be paid to the minimum and maximum amount by which the component (B) is used.

The component (C) or hydrosilylation catalyst is not limited to one particular catalyst, but may be selected from those known in the prior arts. They may include chloroplatinic acid, free platinum, platinum solid carried on a carrier such as alumina, silica, carbon black; platinum vinyl siloxane complex ($Pt_x(ViMe_2SiOSiMe_2Vi)_y$, $Pt[(MeViSiO)_4]_z$, for examples); platinum-phosphine complex ($Pt(PPh_3)_4$, $Pt(PBu_3)_4$, for examples); platinum-phosphite complex ($Pt[P(OPh)_3]_4$, $Pt[P(OBu)_3]_4$, for examples), wherein 'Me', 'Bu', 'Vi' and 'Ph' stand for methyl group, butyl group, vinyl group and phenyl group respectively, and 'x', 'y' and 'z' respectively stand for an integer; $Pt(acac)_2$, wherein 'acac' stands for acetylacetonate; platinum-hydrocarbon complex as disclosed in U.S. Pat. Nos. 3,159,601 and 3,159,662 to Ashby et. al.; and platinum alcoholate complex as disclosed in U.S. Pat. No. 3,220,972 to Lamoreaux et. al.

Besides the above-mentioned platinum compounds, they may also include $RhCl(PPh_3)_3$, $RhCl_3$, $Rh/Al_2O_3$, $RuCl_3$, $IrCl_3$, $FeCl_3$, $AlCl_3$, $PdCl_2.2H_2O$, $NiCl_2$ and $TiCl_4$, for examples.

The above-mentioned catalysts may be used either alone or in combination. Among them, from the aspect of catalyst activity, chloroplatinic acid, platinum-olefin complex, platinum vinyl siloxane complex, $Pt(acac)_2$ and the like are preferred.

The amount by which the catalyst (C) is used is not specifically limited, but may preferably range from $10^{-8}$ to $10^{-1}$ mole, more preferably ranging from $10^{-6}$ to $10^{-2}$ mole per 1 mole of the alkenyl groups contained in the component (A). The curable composition in which such amount is less than $10^{-8}$ mole tends to be slow and unstable to be cured. On the other hand, that in which it is more than $10^{-1}$ mole tends to be hard to secure pot life.

Where appropriate, various fillers, antioxidants, UV absorbers, pigments, surfactants, solvents and silicone compounds may be added to the curable composition comprising the components (A) to (C). Those fillers may include silica fine powder, calcium carbonate, carbon black, clay, talc, titanium oxide, zinc white, diatom earth, barium sulfate and so forth.

(Structure of Carriage Case)

Figure 1:
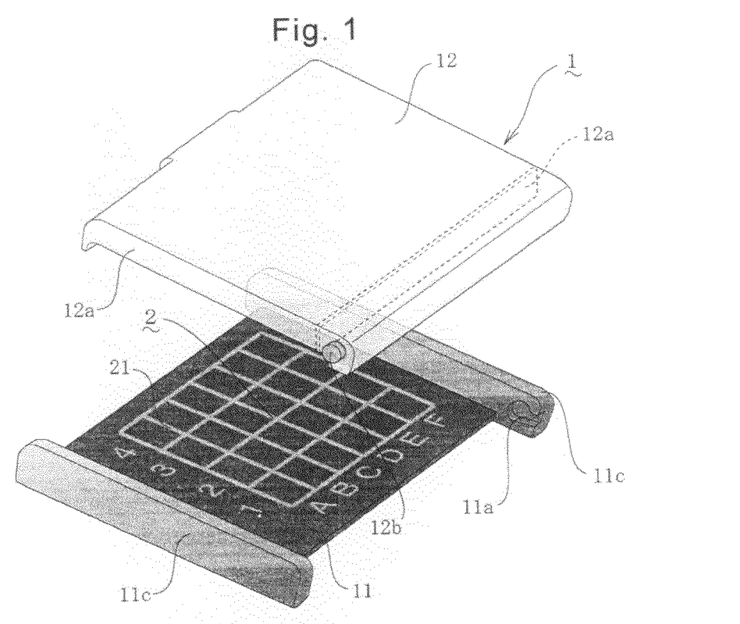
FIG. 1 is a broken perspective view of a carriage case as a whole according to the embodiment of the invention.
Figure 2:
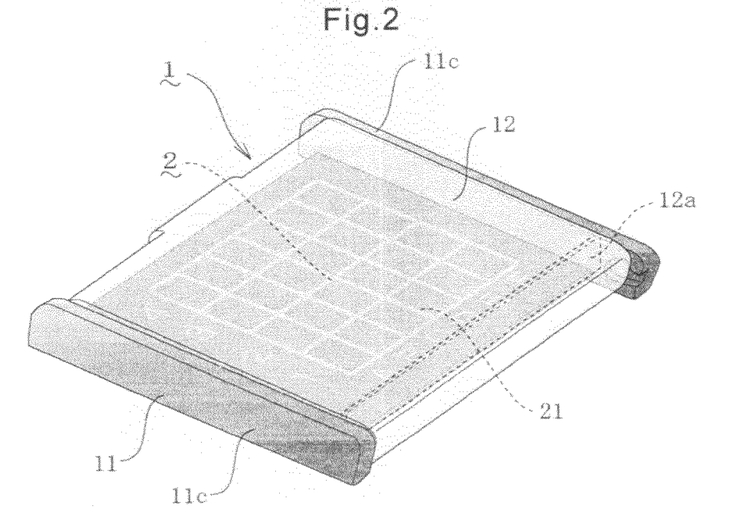
FIG. 2 is a whole perspective view of the carriage case according to the embodiment of the invention.
Figure 3:
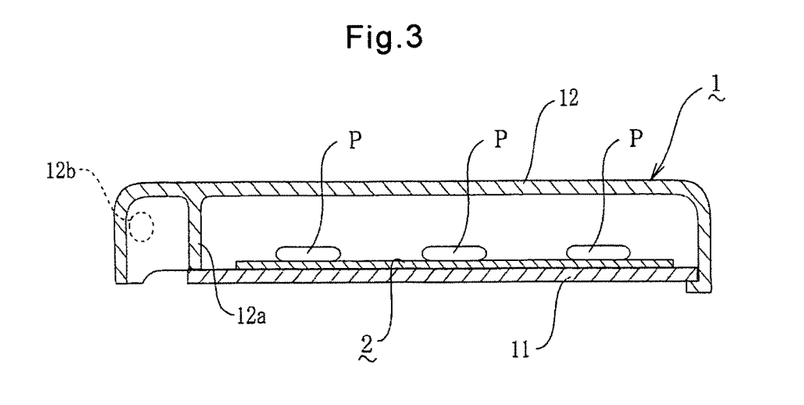
FIG. 3 is an explanatory sectional view of the carriage case embodied according to the invention.
Figure 4:
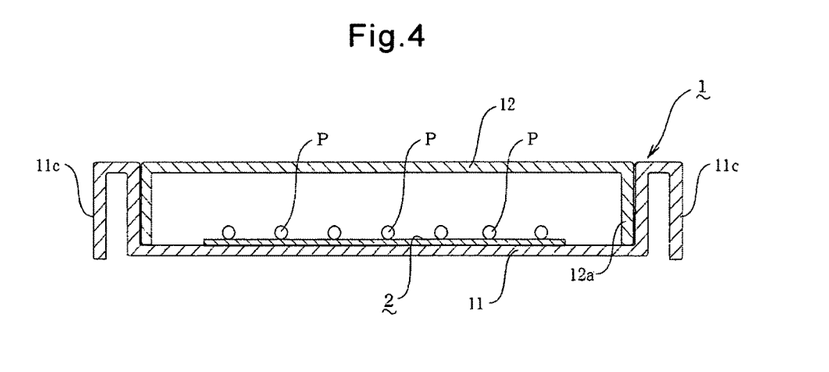
FIG. 4 is an explanatory sectional view of the carriage case embodied according to the invention.

Then, the structure of the carriage case according to the embodiment is explained as follows, which case is a receptacle to receive for transportation electronical parts P therein and has a case body 1 comprising a base member 11 and a cover member 12 (see FIG. 1).

The base member 11 is made from a resinous material having electrical conductivity (stat-kon polycarbonate being exemplified herein) and formed into a bottomed box shape. The sheet member 2 is pasted on the inner bottom surface of the base member 11, on which sheet the electronical parts P are attached to be stably positioned therein (see FIGS. 2 to 4).

According to GC/MS or Gas Chromatography/Mass Spectrometry as known in the prior arts, a resinous material adopted for the base member 11 according to the embodiment allows the outgas emission such as toluene to be restrained to 0.8 ppm or below, preferably 0.6 ppm or below, when the resinous material has been heated for three hours under the temperature of 85 degrees Centigrade. In this embodiment, after a cut portion weighing 0.1 gram of the sample material has been heated for three hours under the temperature of 85 degrees Centigrade, the outgas as generated is trapped for measurement by the afore-said GC/MS or more concretely Dynamic Head Space Gas Chromatography/Mass Spectrometry. Further, it is preferred that this resinous material is electrically conductive, the surface resistivity of which is at $10^8$ Ω/sq. or less, and made from a thermoplastic resin, which may be selected from any one of polycarbonate based resin, polyphenylene ether based resin and polystyrene based resin. Those resins are mixed with a conductive material to be provided with electrical conductivity.

Further, the cover member 12 according to the embodiment may be made from a thermoplastic resin, which resin is preferably transparent and more preferably provided with antistatic property. Such thermoplastic resin may be selected from any one of polycarbonate based resin, polyphenylene ether based resin and polystyrene based resin.

Moreover, according to the embodiment, the hinge connection between the base member 11 and the cover member 12 at their fringe sides facilitates the opening and closing of the case and the provision of an engagement means at the opposite fringe sides to those where the hinge connection is provided allows the cover member 12 to close.

Furthermore, according to the embodiment, ribs 12a are provided on the side surfaces of the cover member 12 opposite to the base member 11, which ribs make into contact with at least a part of the inner side bottom surface of the base member 11 so as to act as grounding means, with the result that electrostatic charge carried on the cover member 12 may escape.

Figure 5:
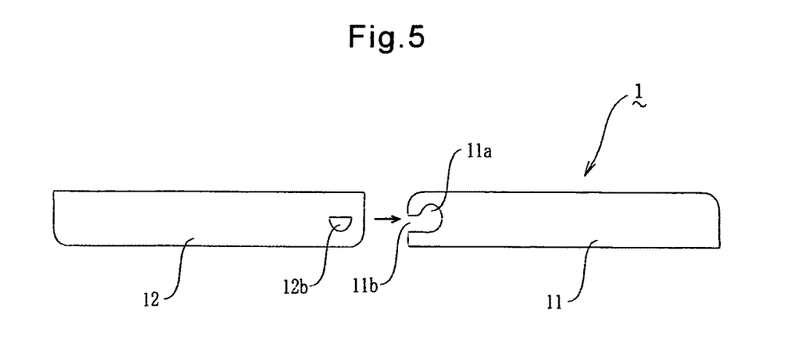
FIG. 5 is an explanatory sectional view of the carriage case embodied according to the invention.
Figure 6:
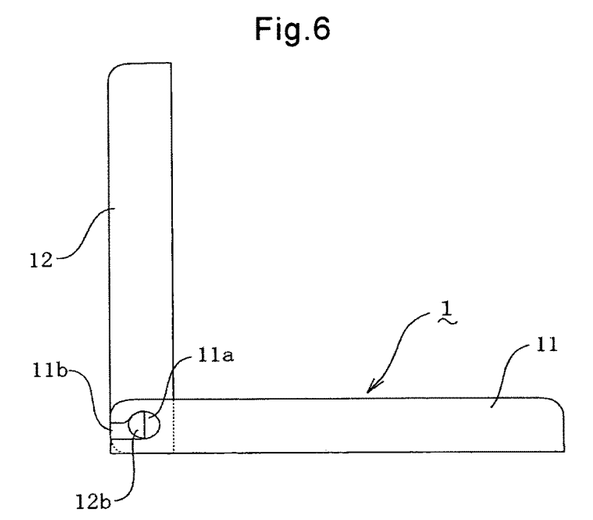
FIG. 6 is an explanatory sectional view of the carriage case embodied according to the invention.

To note, according to the embodiment, a hinge protrusion 12b is formed in the vicinity of the respective opposite corners at the fringe sides of the cover member 12 whereas a hinge receptacle 11a is correspondingly formed on the respective opposite fringe sides of the base member 11, whereby the one hinge protrusion 12b is inserted into the corresponding hinge receptacle 11a and the other hinge protrusion 12b in a substantially semi-circular section is slid through an opening 11b into the corresponding hinge receptacle 11a, thereby, the cover member 12 being pivoted on the base member 11 such that the former is detachable from the latter upon the former being opened flat (see FIGS. 5 and 6).

In this way, when the electronical parts P being disposed on the sheet member 2, the cover member 12 may be removed so that it facilitates an operator to dispose such parts thereon.

Further, according to the embodiment, a side wall 11c is formed on the opposite fringe portions respectively of the base member 11, along which walls ribs 12a of the cover member 12 contact the inner bottom surface of the base member 11 so as to shut up the side surfaces thereof, which physically minimizes the invasion of dust into the case.

Further, according to the embodiment, segments 21 are provided in the sheet member 2, in which respective segments each electronical part P is disposed in an orderly manner so as to prevent it from being mistaken for another.

Figure 7:
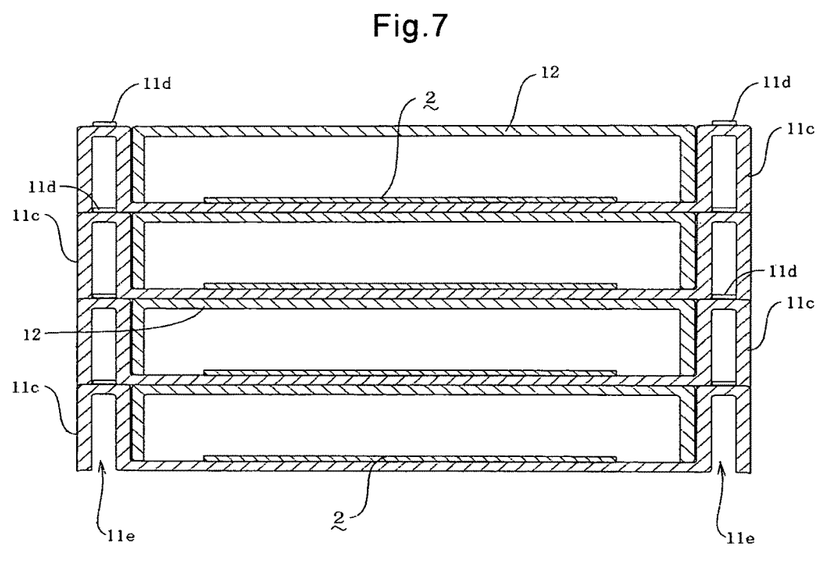
FIG. 7 is an explanatory sectional view of the carriage bodies embodied in the invention to show them stacked one over another.

Furthermore, according to the embodiment, as shown in FIG. 7, the convex portions 11d are provided on an upper surface of the base member 11 while concave portions 11e are provided on a lower surface thereof, into which concave portions the convex portions 11d of another case body 1 are inserted so as to make the case bodies 1 stacked one over another, which allows the case bodies to be transported and stored in a space-saving manner.

The present invention having been substantially described up to here, it is not limited to the embodiment as exemplified in the drawings, but it may be modified in various manners within the scope of the accompanying patent claims. For examples, the shape of the base member 11 (also the cover member 12) may be modified into a deep bottomed shape, or the capacity to accommodate the electronical parts may increase according to the sizes and shapes of such parts P, and the carriage case according to the invention is applicable for the transportation of not only the electronical parts, but also such optical goods as spectacle lenses, any of which modifications belongs to the technical scope of the invention.

NOMENCLATURE

1 case body
11 base member
11a hinge receptacle
11b opening
11c side wall
12 cover member
12a rib
12b hinge protrusion
2 sheet member
21 segment
P electronical part

The invention claimed is:

1. A carriage case, in which electronical parts are received for transportation, comprising:
a case body having a base member and a cover member, the base member and cover member being made from (i) at least one thermoplastic resin selected from the group consisting of a polycarbonate based resin, a polyphenylene ether based resin, and polystyrene based resin that is (ii) mixed with an electrically conductive material,
the cover member has (1) a surface resistivity of $10^8$ Ω/sq or less and includes (2) (a) a top portion, (b) fringe portions, and (c) a plurality of continuous side surfaces, wherein each continuous side surface is directly connected to (i) the top portion of the cover member and (ii) at least two other continuous side surfaces, and (iii) wherein the fringe portions are disposed on at least two opposing side surfaces of the cover member,
the base member has an inner bottom side surface having a plurality of end portions,
the base member also has a sheet member that (1) is made from an adhesive material of a curable composition consisting essentially of component (A): a polyoxyalkylene based polymer having more than one alkenyl groups in one molecule, component (B): a compound having at least two hydrosilyl groups in one molecule and component (C): a hydrosilylation catalyst and (2) is attached on a portion of the inner bottom side surface of the base member and on the parts so as to make the parts securely positioned in the case,
wherein the over member and base member are hinged together by hinge protrusions, and at least two of the continuous side surfaces are configured to be opposite to the base member so to contact at least a portion of the inner bottom side surface of the base member thereby allowing electrostatic charge carried on the cover member to escape.

2. The carriage case according to claim 1, wherein the component (A) of the curable composition for the sheet member has a number-average molecular weight of the polymer ranging from 3,000 to 50,000.

3. The carriage case according to claim 1, wherein the component (B) of the curable composition for the sheet member corresponds to the compound having the hydrosilyl groups as represented with a structural formula 1 below:

(Structural Formula 1)

wherein a relation between the 'm' and 'n' is expressed with $1<m+n\leq40$, $1<m\leq20$, $0<n\leq38$ and 'R' stands for a hydrocarbon group having a main chain having 2 to 20 carbon atoms and may contain one or more phenyl groups.

4. The carriage case according to claim 1, wherein the base member of the case body is made from a resinous material having electrical conductivity and formed into a bottomed box shape.

5. The carriage case according to claim 1, wherein hinge protrusions are disposed on opposite corners of the fringe portions of the cover member wherein hinge receptacles are correspondingly formed on the base member, wherein a first hinge protrusion is inserted into a first hinge receptacle and a second hinge protrusion comprising a substantially semicircular cross section is slid through the opening into a second hinge receptacle, whereby the cover member is configured to pivot on the base member and whereby the cover member is detachable from the base member upon the cover member being opened flat.

6. The carriage case according to claim 5, wherein side walls are formed on the base member opposite of the fringe portions of the cover member and wherein at least two of the continuous side surfaces of the cover member are configured to abut the side walls of the base member and enclose end portions of the base member.

7. The carriage case according to claim 1, wherein the base member of the case body has an outgas emission of 0.8 ppm or below when a 0.1 gram portion of the base member is heated for three hours at a temperature of 85° C. while subjected to a GC/MS method.

8. The carriage case according to claim 1, wherein convex portions are provided on an upper surface of the base member while concave portions are provided on a lower surface thereof, into the concave portions the convex portions of another case body are inserted so as to make a plurality of the case bodies stacked one over another.

9. The carriage case according to claim 1, wherein the component (A) of the curable composition for the sheet member has a number-average molecular weight of the polymer ranging from 1,000 to 70,000 and wherein the component (B) of the curable composition for the sheet member has a number-average molecular weight that range from 400 to 3000.

10. The carriage case according to claim 1, wherein the curable composition for the sheet member has a ratio 0.7 or more hydrosilyl groups compared to alkenyl groups, wherein the ratio is calculated as follows: [amount of hydrosilyl groups in component (B)]/[amount of alkenyl groups contained in component (A)].

11. The carriage case according to claim 10, wherein the component (A) of the curable composition for the sheet member has a number-average molecular weight of the polymer ranging from 1,000 to 70,000 and wherein the component (B) of the curable composition for the sheet member has a number-average molecular weight that range from 400 to 3000.

12. The carriage case according to claim 11, wherein the base member is made from the polycarbonate based resin.

13. The carriage case according to claim 12, wherein the cover member is transparent and has antistatic properties.

14. The carriage case according to claim 1, wherein at least one continuous side surface is configured to (i) overhang at least one edge portion of one end portion of the inner bottom side surface of the base member and (ii) interlock the at least one edge portion of one end portion of the inner bottom side surface of the base member with the at least one side surface configured to overhang the at least one edge portion of one end portion of the inner bottom side surface of the base member.

15. The carriage case according to claim 14, wherein the at least one continuous side surface configured to overhang the at least one edge portion of one end portion of the inner bottom side surface is a lip, wherein the lip is configured to interlock with a bottom surface of the at least one edge portion of one end portion of the inner bottom side surface.

* * * * *